(12) United States Patent
Terhune, IV (10) Patent No.: US 7,909,621 B1
(45) Date of Patent: Mar. 22, 2011

(54) SOCKET CONNECTOR HAVING CONTACT TERMINAL TAIL WITH SPLIT SOLDER BALL RETAINED THEREON AND METHOD FABRICATING THE SAME

(75) Inventor: Albert Harvey Terhune, IV, Chandler, AZ (US)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 12/652,042

(22) Filed: Jan. 5, 2010

(51) Int. Cl.
*H01R 12/00* (2006.01)
*H05K 1/00* (2006.01)
(52) U.S. Cl. ......................................................... 439/83
(58) Field of Classification Search ...................... 439/65, 439/342, 71, 66, 83
See application file for complete search history.

(56) References Cited

U.S. PATENT DOCUMENTS

| 6,425,771 B1 * | 7/2002 | Shirai et al. ...................... 439/83 |
| 7,226,296 B2 | 6/2007 | Ngo |
| 2002/0039854 A1 | 4/2002 | Shirai et al. |

FOREIGN PATENT DOCUMENTS

| CN | 2610515 Y | 4/2004 |
| CN | 2872630 Y | 2/2007 |

* cited by examiner

*Primary Examiner* — Javaid Nasri
(74) *Attorney, Agent, or Firm* — Andrew C. Cheng; Wei Te Chung; Ming Chieh Chang (57) ABSTRACT

An electrical connector includes an insulative housing with a number of passageways, a number of electrical contacts received in the passageways and a number of solder balls disposed on the electrical contacts respectively. Each electrical contact includes a contacting portion projecting out of the insulative housing, a retention portion retained in the passageways, and a solder portion. Each solder ball defines a gap which can be deformed to close the solder portion of the electrical contact by external force.

17 Claims, 8 Drawing Sheets

SOCKET CONNECTOR HAVING CONTACT TERMINAL TAIL WITH SPLIT SOLDER BALL RETAINED THEREON AND METHOD FABRICATING THE SAME

BACKGROUND OF THE INVENTION

1. Field of the Invention

The present invention relates to a socket connector, and more particularly, to a socket connector with contact terminal tails retained thereon of split solder balls.

2. Description of Related Art

Central processing unit (CPU) sockets are used to transmit signals between a CPU and a printed circuit board in computer device. Generally, the CPU socket comprises an insulative housing and a plurality of conductive terminals. Each of the conductive terminals electrically connects with the printed circuit board through surface mounting technology (SMT) by pre-setting solder balls on one end thereof.

Chinese Patent No. 2610515Y issued to Lotes on Apr. 7, 2004 discloses one type of electrical connector which includes an insulative housing 12 and a number of electrical contacts 14. The insulative housing 12 defines a number of straight passageways 120 for receiving the electrical contacts 14 therein and a projection 122 is disposed in a lower end of the passageways 120. The electrical contact 14 is configured to a U-shaped configuration and has a pair of solder tails at a lower end thereof for receiving solder ball. The electrical contacts are used to pre-set the solder balls before surface mounting to the PCB.

Chinese Patent No. 2872630Y issued to Lotes on Feb. 21, 2007 discloses another type of electrical connector for pre-setting solder balls. The electrical connector includes an insulative housing 1 with passageways 10 therein and a plurality of electrical contacts 2 received in the passageways 10. The insulative housing 1 defines a number of solder ball receiving portions 12. Bottom end 21 of the contact 2 and side wall 14 of the solder receiving portions 12 define a receiving space 16 for the solder ball 3 moveably received therein. The solder balls are hold by the side wall 14 and the bottom end 21 of the contact 2 whereby to be pre-set on the electrical connector.

The above electrical connectors are two schemes to locate the solder balls thereon before surface mounting to the PCB. The present invention provides a different method to locate and connect the solder ball.

BRIEF SUMMARY OF THE INVENTION

An object of the present invention is to provide an electrical connector with split solder balls disposed on the contacts thereof before surface mounting to the printed circuit board and method fabricating the same.

An electrical connector comprises an insulative housing having a plurality of passageways extending therethrough, a plurality of electrical contacts received in the passageways and a plurality of solder balls disposed the electrical contacts respectively. Each electrical contact includes a contacting portion projecting out of a top surface of the insulative housing, a retention portion retained in the passageways, and a solder portion disposed out of a bottom surface of the insulative housing. Each solder ball defines a gap thereon before attached to the solder portion for surrounding the solder portion and said gap is deformable to secure the solder ball on the solder portion by external force.

A method of attaching solder balls to electrical contacts comprises the following steps: providing an electrical connector including an insulative housing and a plurality of electrical contacts on the insulative housing, each contacts having a solder tail extending beyond a bottom surface of the insulative housing, providing a plurality of solder balls with split thereon, providing an attachment device to position the solder balls corresponding to the electrical contacts respectively, and actuating the attachment device to exert force on the split solder balls thereby retaining the solder balls to the electrical connector.

Other objects, advantages and novel features of the invention will become more apparent from the following detailed description of the present embodiment when taken in conjunction with the accompanying drawings.

DETAILED DESCRIPTION OF THE PREFERRED EMBODIMENT

Reference will be made to the drawing figures to describe the present invention in detail, wherein depicted elements are not necessarily shown to scale and wherein like of similar elements are designated by same or similar reference numeral through the several views and same or similar terminology.

Figure 1:
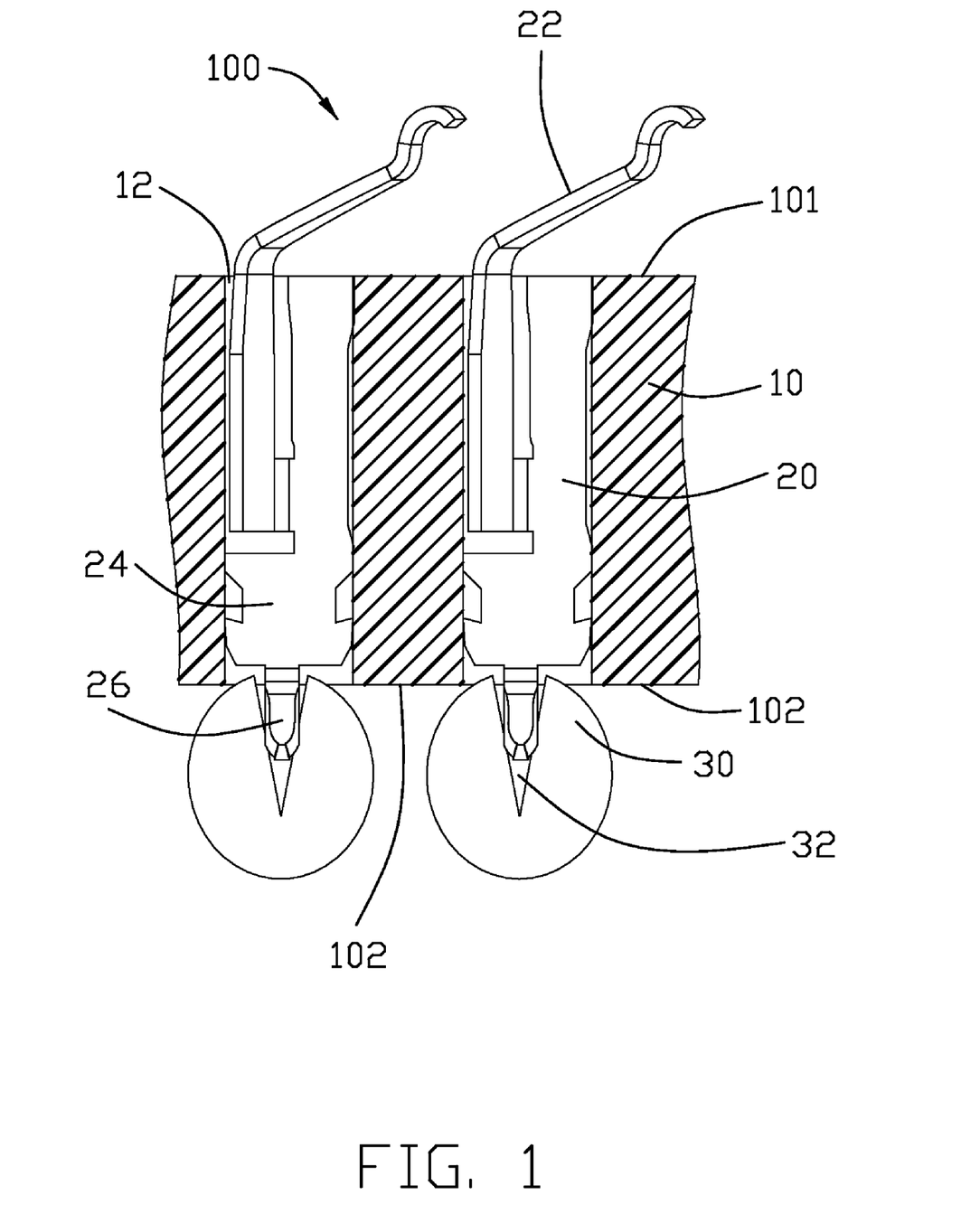
FIG. 1 is a sketch view of the electrical connector of a preferred embodiment according to the present invention.
Figure 2:
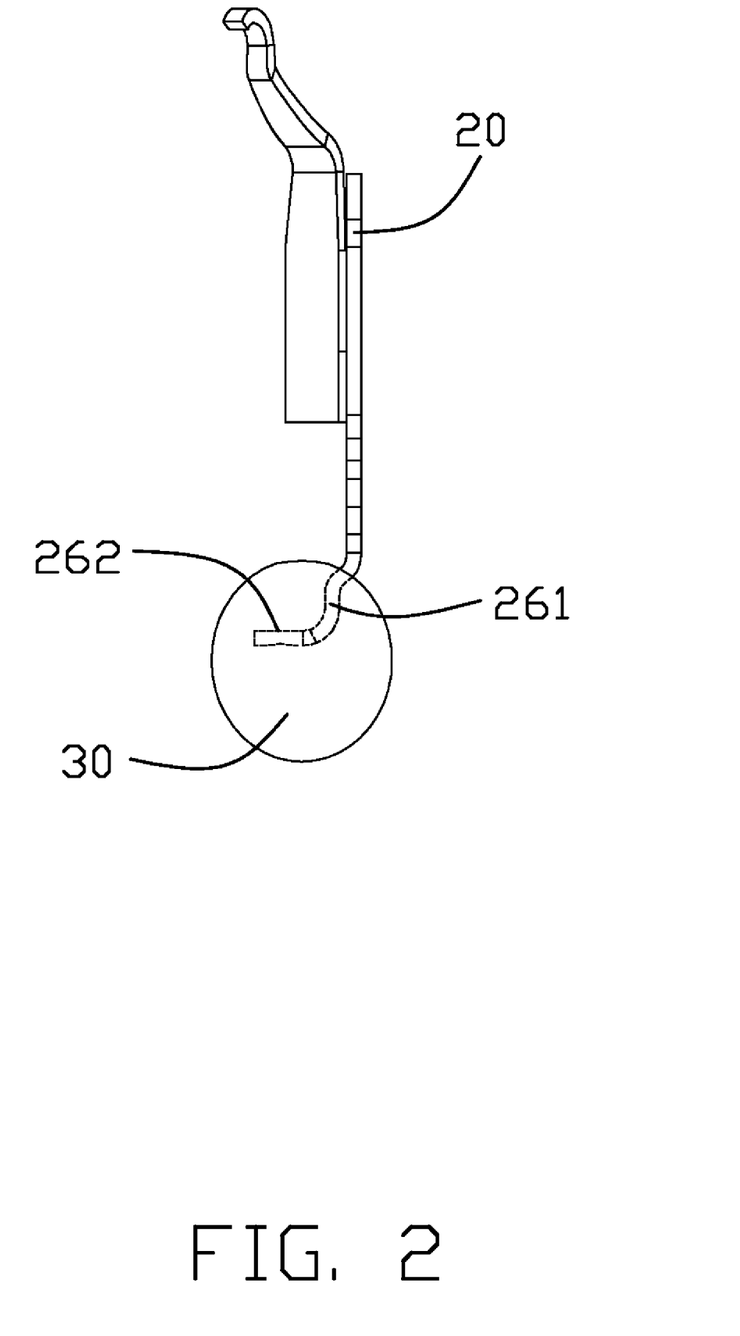
FIG. 2 is a side view of the electrical contact and the solder ball shown in FIG. 1.

Please referring FIGS. 1 and 2, an electrical connector 100 according to the present invention are used to establish electrical connection between a central process unit (not shown) and a printed circuit board (not shown), and comprises an insulative housing 10 having a plurality of passageways 12 extending therethrough and a plurality of electrical contacts 20 (only one is shown) received in the passageways 12.

Each electrical contact 20 has a contacting portion 22 projecting out of a top surface 101 of the insulative housing 10, a retention portion 24 retained in the passageways 12, and a solder portion 26 extending out of a bottom surface 102 of the insulative housing 102. The solder portion 26 and the contacting portion 22 are located at same side of the retention portion 24. The solder portion 26 includes a vertical section 261 and a horizontal section 262 bending from the vertical section 261, and the solder ball 30 is engaged with the horizontal section 262.

A plurality of split solder balls 30 are disposed on the solder portions 26 of the electrical contacts 26 respectively and each defines a gap 32 thereon before attached to the solder portion 26. The gap 32 is surrounding the solder portion 26 and deformable to secure the solder ball 30 on the solder portion 26 by external force.

FIG. 3-FIG. 6 show an attachment device used to machining the gap 32 on the solder ball 30 and dispose the solder ball 30 to the electrical contact 20. The attachment device includes a stationary base 40 defining a plurality of tapered apertures 42 (only one is shown for illustration) and a top plate 50 moveably mounted on the stationary base 40. The solder balls 30 are disposed in the apertures 42, respectively. The stationary base 40 defines a plurality of channels 44 communicated with the apertures 42 thereby generating vacuum suction F to the solder ball 30 to secure the solder ball 30 on the stationary base 40. The top plate 40 is driven by the spring-loaded compression mechanism 46 to move upwardly and downwardly relative to the base 40.

Figure 3:
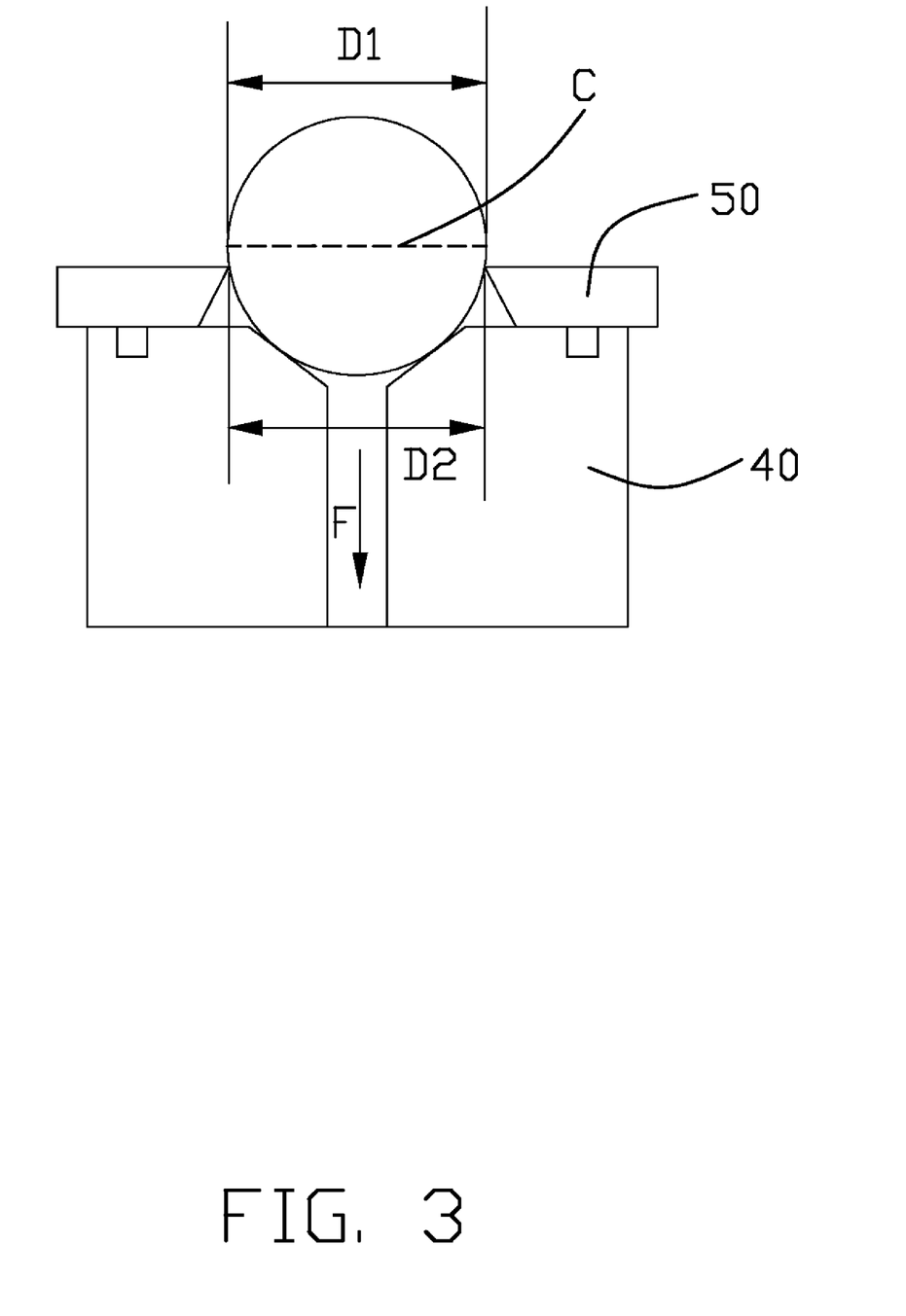
FIG. 3 is a sketch view of the attachment device of the present invention with solder balls disposed thereon.
Figure 4:
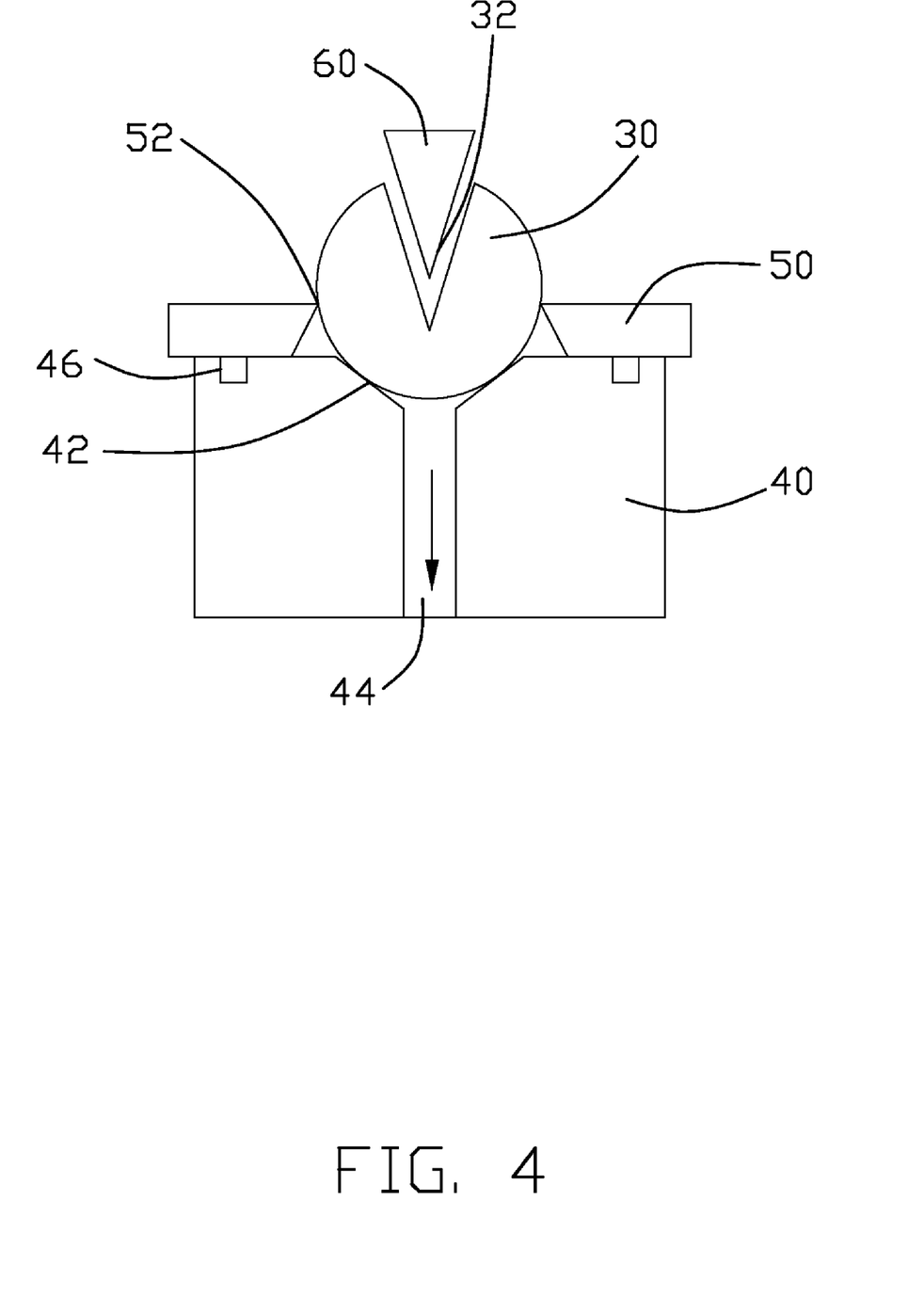
FIG. 4 is a sketch view showing how to form the gap on the solder ball.

Please refer to FIGS. 3 and 4, the V-shape split or gap 32 is created on the solder ball 30 by a mechanical knife 60 before attaching to the electrical contacts 20. The top plate 50 defines a plurality of apertures 52 corresponding to the solder balls 30 and each aperture 52 has a smaller diameter D2 than the diameter D1 of the solder ball 30 which also provides a retention force for the solder ball 30.

Figure 5A:
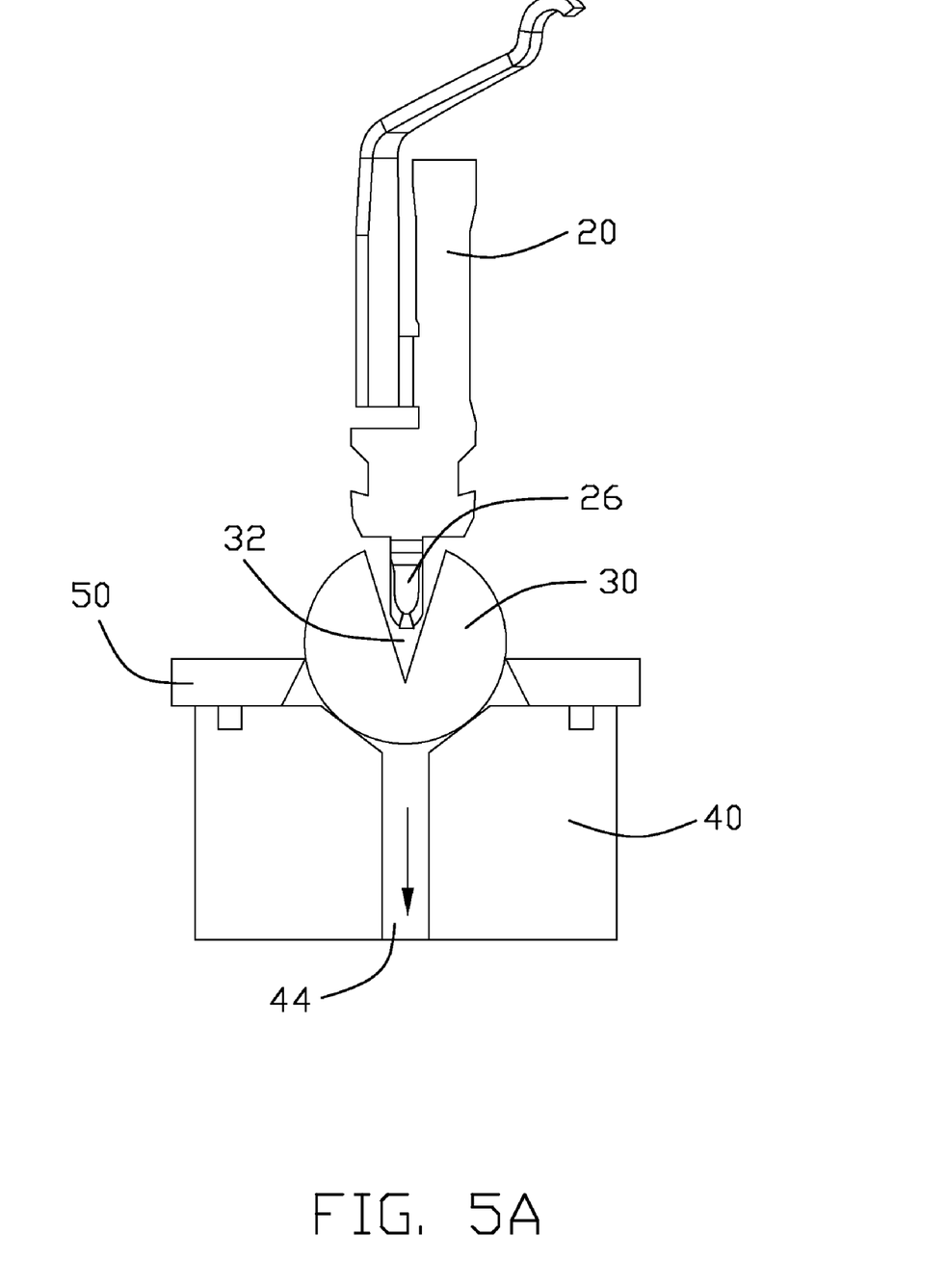
FIGS. 5A-5C show the process of attaching the solder balls to the electrical contacts.
Figure 5B:
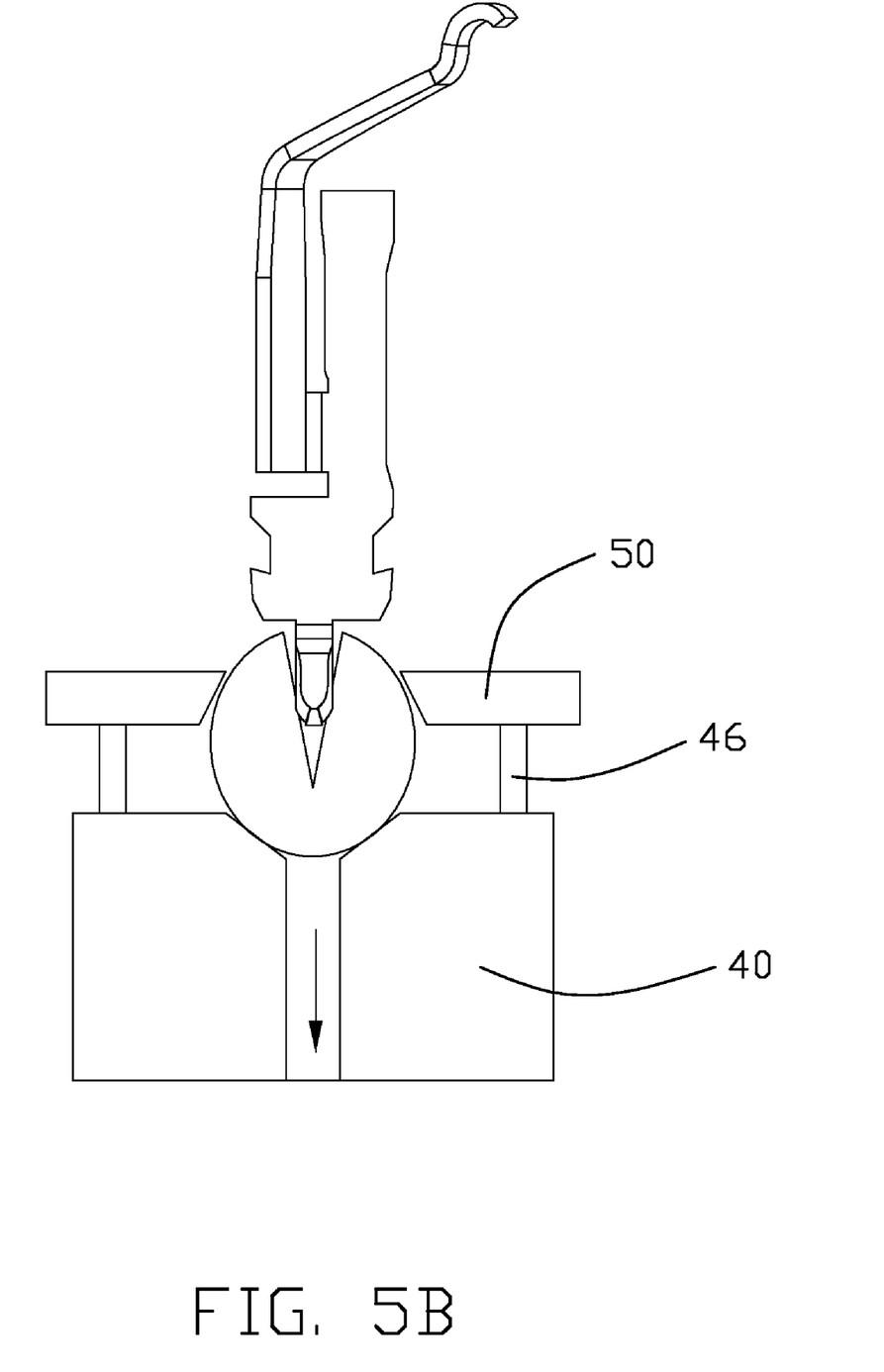
Figure 5C:
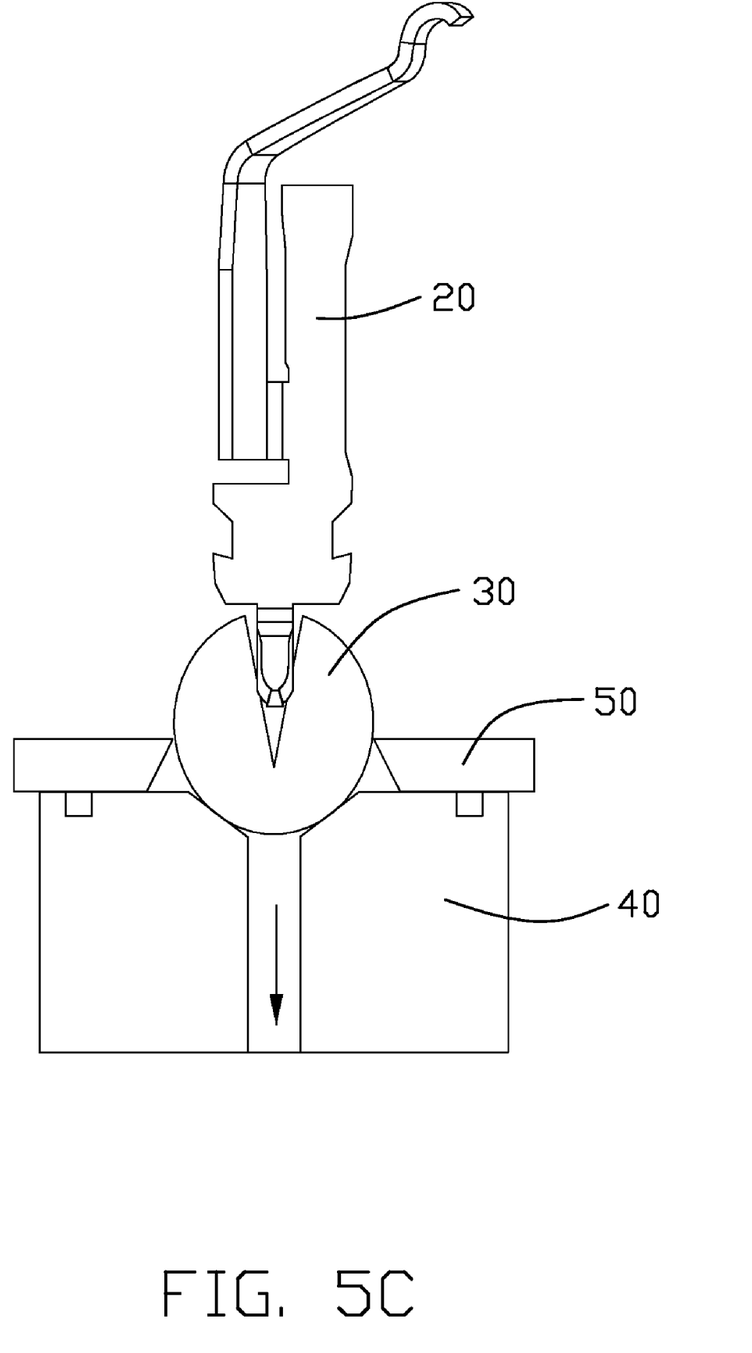

After creating split on each of the solder balls 30, the next step is to add the solder balls 30 to the electrical contacts 20. Please referring to FIG. 5A, the electrical contacts 20 are located on the top of the attachment device with the solder portion 26 arranged in the gap 32 of the solder balls 30. The top plate 50 is located on the base 40. Then the top plate 50 moves upwardly beyond the centerline C of the solder ball 30. Since the diameter of solder ball 30 is greater than the diameter of the aperture 52, the top plate 50 presses the solder balls 30 to close the gap 32 during upward movement. Therefore, the gap 32 of the solder ball 30 is deformable to surround the solder portion 26 and secured to the electrical contact 20. In the same time, the shape of the solder ball 30 changes from spherical to oval as shown in FIG. 5B. Finally, once the solder ball 30 is secured on the electrical contact 20, the top plate 50 retracts back to the stationary base 40 to allow the electrical connector 100 with solder ball 30 to be released as shown in FIG. 5C.

It is likely that excessive material will be remained at a lower end of the gap 32 during the splitting process, the upward and downward movement of the top plate 50 can remove the excessive material. The aperture 52 of the top plate 50 applies an external force to the outer surface of the solder ball 30. Then the electrical connector 100 with split solder balls secured thereon can be surface mounted to the printed circuit board.

Figure 6:
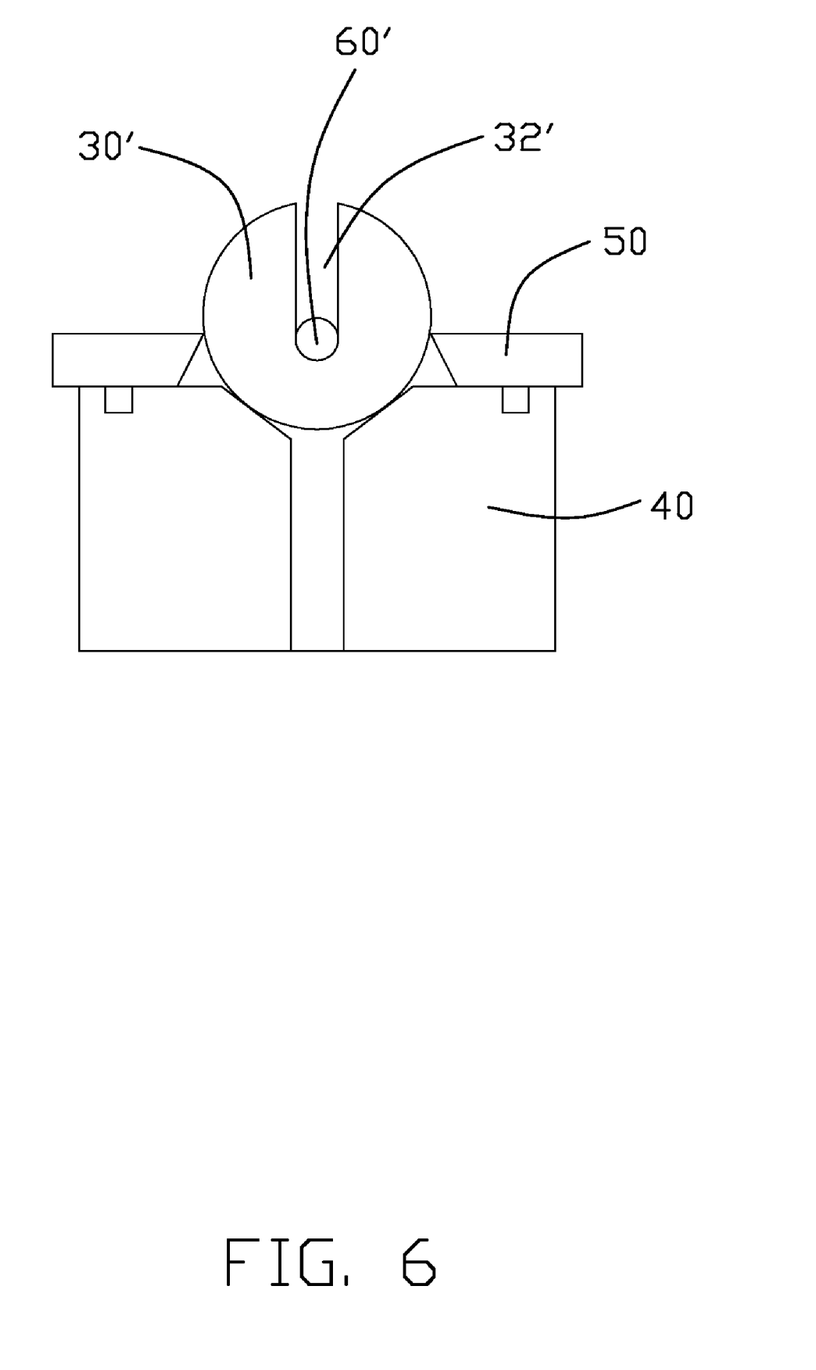
FIG. 6 is another embodiment of the solder balls according to the present invention.

Please refer to FIG. 6 which shows another embodiment of the present invention. The structure of the solder ball 30' is different with the above embodiment. In this embodiment, the gap 32' is configured to a rectangular shape which is created by a different knife 60'. Furthermore, splitting or cutting process could also be done with other blades or knifes at room temperature.

The splitting process also could be done by high temperature wire to slice through the solder ball to create necessary feature. In addition, although the external force is applied to the solder ball 30 by the top plate 50, the external force also could be applied by the electrical contacts. For example, the solder ball defines a hole therein, the electrical contact could piece into the solder ball and project into the hole which also could pre-set the solder ball to the electrical contact.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

I claim:

1. An electrical connector comprising:
   an insulative housing having a plurality of passageways extending therethrough;
   a plurality of electrical contacts received in the passageways and each comprising a contacting portion projecting out of a top surface of the insulative housing, a retention portion retained in the passageways, and a solder portion disposed adjacent to a bottom surface of the insulative housing; and
   a plurality of solder balls disposed on the solder portions of the electrical contacts respectively and each defining a gap surrounding the solder portion, the gap becoming smaller so that the solder ball clamps the solder portion.

2. The electrical connector as claimed in claim 1, wherein the gap is configured to a V-shape.

3. The electrical connector as claimed in claim 1, wherein the gap is configured to a rectangular shape.

4. The electrical connector as claimed in claim 1, wherein the solder portion includes a vertical section and a horizontal section bending from the vertical section, and the solder ball is attached to the horizontal section.

5. The electrical connector as claimed in claim 1, wherein the solder portion and the contacting portion are located at same side of the retention portion.

6. The electrical connector as claimed in claim 1, wherein shape of the solder ball changes from spherical to oval after the solder ball secured to the solder portion.

7. The electrical connector as claimed in claim 1, wherein the solder portion and the solder balls are located outside of the insulative housing.

8. The electrical connector as claimed in claim 1, wherein the solder ball clamps the solder portion at room temperature.

9. A method of attaching solder balls to electrical contacts comprising:
   providing an electrical connector including an insulative housing and a plurality of electrical contacts on the insulative housing, each contacts having a solder tail adjacent to a bottom surface of the insulative housing;
   providing a plurality of solder balls with split thereon; and
   positioning the split solder ball; and
   moving the positioned split solder ball toward the solder portion and making the split become smaller such that the split solder ball is attached to the solder portion.

10. The method of attaching solder balls to electrical contacts as claimed in claim 9, wherein the split solder balls are attached to the solder tails by an attachment device, and the attachment device comprises a stationary base defining a plurality of tapered apertures for receiving the solder balls therein.

11. The method of attaching solder balls to electrical contacts as claimed in claim 10, wherein the stationary base defines a plurality of channels communicated with the apertures thereby generating vacuum pressure to the solder ball and securing the solder ball on the stationary base.

12. The method of attaching solder balls to electrical contacts as claimed in claim 11, wherein the split is formed on the solder ball by the attachment device and a mechanical knife before attaching to the electrical contact.

13. The method of attaching solder balls to electrical contacts as claimed in claim 10, wherein the attachment device includes a top plate moveable mounted on the stationary base, and wherein the top plate exerts force on the solder ball so that the solder ball is set on the solder tail of the electrical contact.

14. The method of attaching solder balls to electrical contacts as claimed in claim 13, wherein the top plate defines a plurality of apertures corresponding to the solder balls and each aperture has a smaller diameter than the solder ball, and wherein the top plate moves upwardly and urges the split solder ball to close and sandwich the solder tail.

15. The method of attaching solder balls to electrical contacts as claimed in claim 14, wherein the top plate moves downwardly thereby making the electrical connector with the solder balls thereon taken away from the stationary base.

16. An electrical connector comprising:
   an insulative housing defining a plurality of passageways;
   a plurality of contacts disposed in the corresponding passageways, respectively, each of said contacts stamped from sheet metal and defining an upper contact section and a lower mounting section; and
   a plurality of solder masses each initially equipped with a V-shaped groove in communication with an exterior corresponding to the mounting sections of the contacts, respectively, under condition that said V-shaped groove defines a groove extension direction along a bottom edge thereof; wherein
   said mounting section is inserted into the V-shaped groove of the corresponding solder mass, and secured to said solder mass in a manner that a transversely extending direction of said mounting section is same with said groove extension direction.

17. The electrical connector as claimed in claim 16, wherein securement between the solder mass and said mounting section results from deformation of said solder mass.

* * * * *